United States Patent [19]
Ohta et al.

[11] Patent Number: 5,103,286
[45] Date of Patent: Apr. 7, 1992

[54] THERMOELECTRIC MODULE AND PROCESS FOR PRODUCING THEREOF

[75] Inventors: Toshitaka Ohta; Takenobu Kajikawa, both of Tsukuba, Japan

[73] Assignee: Agency of Industrial Science and Technology, Tokyo, Japan

[21] Appl. No.: 431,201

[22] Filed: Nov. 3, 1989

Related U.S. Application Data

[62] Division of Ser. No. 292,888, Jan. 3, 1989, Pat. No. 4,902,648.

[30] Foreign Application Priority Data

Jan. 5, 1988 [JP] Japan .................. 63-000573
Jan. 5, 1988 [JP] Japan .................. 63-000574

[51] Int. Cl.⁵ ............................................. H01L 23/56
[52] U.S. Cl. ................................. 357/68; 358/28; 358/87; 358/71
[58] Field of Search ................. 357/28, 87, 68, 71

[56] References Cited

U.S. PATENT DOCUMENTS

| | | | |
|---|---|---|---|
| 3,276,915 | 10/1966 | Horsting et al. | 357/81 |
| 3,377,206 | 4/1968 | Hanlein et al. | 357/81 |
| 3,580,743 | 5/1971 | McPhee et al. | 437/903 |
| 3,781,176 | 12/1973 | Penn et al. | 437/903 |
| 3,851,381 | 12/1974 | Alais et al. | 439/903 |
| 4,081,895 | 4/1978 | Gemano et al. | 357/87 |
| 4,149,025 | 4/1979 | Niculescu | 437/903 |
| 4,268,710 | 5/1981 | Hampl, Jr. | 136/205 |
| 4,493,939 | 1/1985 | Blaske et al. | 357/87 |
| 4,855,810 | 8/1989 | Gelb et al. | 357/87 |
| 4,902,648 | 2/1990 | Ohta et al. | 437/247 |
| 4,907,060 | 3/1990 | Nelson et al. | 357/87 |

FOREIGN PATENT DOCUMENTS 0253677 10/1988 Japan .
1033018 6/1966 United Kingdom ............... 437/903

OTHER PUBLICATIONS

"The Sintering of Bismuth Telluride", Sharples et al., Nelson Research Laboratories, English Electric Co., Proc. Phys. Soc. 74, 768, (1959), pp. 768-770.
"Thermoelectric Refrigeration", Goldsmid, *The International Cyrogenics Monograph Series,* Plenum Press, N.Y. 1964, pp. 198-200.
"Production of Alloys of Bismuth Telluride for Solar Thermoelectric Generators", Durst et al., *Solar Energy Materials* 5 (1981), pp. 181-186.

*Primary Examiner*—Andrew J. James
*Assistant Examiner*—Viet Q. Nguyen
*Attorney, Agent, or Firm*—Spencer, Frank & Schneider

[57] ABSTRACT

A thermoelectric module comprising a first electrode array having a plurality of electrode pieces and a second electrode array having a plurality of electrode pieces. The first and second electrode arrays are spaced apart from each other. The electrode pieces of the first electrode array are alternately connected with the electrode pieces of the second electrode array via thermoelectric elements. The connections are such that one end portion of each electrode piece of the first electrode array is connected with one end portion of an electrode piece of the second electrode array through a thermoelectric element of a first conductive type. The other end portion of an electrode piece of the first electrode array is connected with one end portion of another electrode piece of the second electrode array through a thermoelectric element of a second conductive type. The weight per unit output of the thermoelectric module is small.

25 Claims, 4 Drawing Sheets

THERMOELECTRIC MODULE AND PROCESS FOR PRODUCING THEREOF

This is a division of application Ser. No. 07/292,888 filed Jan. 3, 1989, now U.S. Pat. No. 4,902,648.

BACKGROUND OF THE INVENTION

1. Field of the Invention

The present invention relates to thermoelectric modules and processes for producing the same. More particularly, the invention relates to a thermoelectric module using a small amount of material per unit output thereof, and a process for producing thermoelectric modules of the kind described above with a high yield and a low processing cost.

2. Description of the Prior Art

Conventional thermoelectric modules are produce by a process comprising cutting a melt-grown ingot of thermoelectric material into bulk thermoelectric elements and bonding electrodes to the thermoelectric elements through soldering or the like. According to an alternative process, a chalcogenide alloy powder is vacuum-sealed or sealed with inert gas in an ampule and sintered to produce thermoelectric elements. Thermoelectric elements which are formed in these processes have a high figure of merit and provide the advantage of giving good thermoelectric conversion characteristics to thermoelectric modules.

However, the conventional production of thermoelectric modules in which use is made of an ingot of thermoelectric material involves the following serious problems:

(1) since the yield of thermoelectric elements notably decreases when the thickness thereof is reduced to 1.5 mm or less, miniaturization of thermoelectric elements is difficult, with the result that the amount of a thermoelectric material used is inevitably large per unit output of a thermoelectric module and the material cost is high;

(2) because of cracking of the thermoelectric material in the cutting step and a high probability that electric conduction will be poor or that a short circuit will occur across electrodes because of electrodes that fail to bond to the thermoelectric elements through soldering or the like technique, the yield is notably lowered through the process of production of thermoelectric nodules with a high probability that defective nodules will be formed; and (3) since thermoelectric elements not only are produced one by one but also are brittle, automation of the production process is difficult and hence the processing cost is high.

The alternative process, in which use is made of sintering of a chalcogenide alloy powder, has the problem of low productivity because pressure molding is necessary and moldings must be sintered while being sealed in a container such as an ampule. And by this alternative process, thermoelectric elements are produced one by one in the same manner as the conventional process, so that automation of the production process and reduction of processing cost are difficult.

SUMMARY OF THE INVENTION

The present invention has been made with a view to solving the above-mentioned problems of the prior art.

An object of the present invention is to provide a thermoelectric module having a light weight per unit output thereof.

Another object of the present invention is to provide a thermoelectric module having thermoelectric elements improved in mechanical strength, the production of which can be easily automated.

Still another object of the present invention is to provide a process according to which thermoelectric modules of the kind described above can be produced with a high yield and at a low processing cost.

A further object of the present invention is to provide a process for producing a thermoelectric module in which sintering for forming thermoelectric elements can be effected without a pressure molding process.

A still further object of the present invention is to provide a process for producing a thermoelectric module in which sintering for forming thermoelectric elements can be effected in a non-oxidizing gas flow without sealing the thermoelectric elements or a module being produced, in a container.

In the first aspect of the present invention, a thermoelectric module which is comprising:

a first electrode array having a plurality of electrode pieces and a second electrode array having a plurality of electrode pieces, the first and second electrode arrays being confronted with each other, the electrode pieces of the first electrode array being alternately connected with the electrode pieces of the second electrode array in such a way that one end portion of each electrode piece of the first electrode array is connected with one end portion of an electrode piece of the second electrode array through a thermoelectric element of first conductive type while the other end portion of the each electrode piece of the first electrode array is connected with one end portion of another electrode piece of the second electrode array through a thermoelectric element of second conductive type except that one end portion of any electrode piece and one end portion of another electrode piece are reserved for output terminals.

The thermoelectric elements of first and second conductive types may be made of chalcogenide alloys.

The thermoelectric elements of first and second conductive types may be respectively made of p-type and n-type bismuth-antimony-selenium-tellurium alloys.

The material of the electrode pieces may be a member selected from the group consisting of tungsten, molybdenum, nickel, composite materials of copper or aluminum coated or plated with tungsten, molybdenum or nickel, composite materials of copper or aluminum clad with tungsten foil or molybdenum foil, and composite materials of tungsten, molybdenum or nickel coated or plated with antimony.

The thermoelectric elements of first and second conductive types may be made of chalcogenide alloys containing 2 weight % or less of a lead oxide glass frit admixed therewith.

The chalcogenide alloys may be bismuth-antimony-selenium-tellurium alloys.

The electrode pieces of the first electrode array may be alternately connected with the electrode pieces of the second electrode array through only the thermoelectric elements.

In the second aspect of the present invention, a process for producing a thermoelectric module, comprising the steps of:

disposing on a holder a plurality of electrode pieces to constitute a first electrode array, while separately disposing on another holder a plurality of electrode pieces to constitute a second electrode array;

forming a layer of a thermoelectric material of first conductive type on one end of the surface of each disposed electrode piece of the first electrode array, while separately forming a layer of a thermoelectric material of second conductive type, different from the first conductive type, on one end of the surface of each disposed electrode piece of the second electrode array;

positioning the first and second electrode arrays to alternately connect the electrode pieces of the first electrode array with the electrode pieces of the second electrode array in such a way that one end of each electrode piece of the first electrode array is connected with one end of an electrode piece of the second electrode array through the layer of the thermoelectric material of first conductive type while the other end of the each electrode piece of the first electrode array is connected with one end of another electrode piece of the second electrode array through the layer of the thermoelectric material of second conductive type; and heating the positioned first and second electrode arrays and thermoelectric material layers to sinter the thermoelectric material layers to thereby form the thermoelectric module.

The layers of the thermoelectric materials of first and second conductive types may be formed without pressing.

The sintering may be effected in a non-oxidizing gas flow.

In the third aspect of the present invention, a process for producing a thermoelectric module, comprising the steps of:

disposing on a holder a plurality of electrode pieces to constitute a first electrode array, while separately disposing on another holder a plurality of electrode pieces to constitute a second electrode array;

forming a layer of a thermoelectric material of first conductive type on one end of the surface of each disposed electrode piece of one electrode array selected from the first and second electrode arrays, while forming a layer of a thermoelectric material of second conductive type, different from the first conductive type, on the other end;

positioning the first and second electrode arrays to alternately connect the electrode pieces of the first electrode array with the electrode pieces of the second electrode array in such a way that one end of each electrode piece of the first electrode array is connected with one end of an electrode piece of the second electrode array through the corresponding layer of the thermoelectric material of first conductive type while the other end of the each electrode piece of the first electrode array is connected with one end of another electrode piece of the second electrode array through the corresponding layer of the thermoelectric material of second conductive type; and heating the positioned first and second electrode arrays and thermoelectric material layers to sinter the thermoelectric material layers to thereby form the thermoelectric module.

The layers of the thermoelectric materials of first and second conductive types may be formed without pressing.

The sintering may be effected in a non-oxidizing gas flow.

In the fourth aspect of the present invention, a process for producing a thermoelectric module, comprising the steps of:

forming on a holder a plurality of layers of a thermoelectric material of first conductive type each having a predetermined form and a plurality of layers of a thermoelectric material of second conductive type, different from the first conductive type, each having a predetermined form without pressing;

sintering the formed layers in a non-oxidizing gas flow to form thermoelectric elements of first and second conductive types;

disposing on a holder a plurality of electrode pieces to constitute a first electrode array, while separately disposing on another holder a plurality of electrode pieces to constitute a second electrode array;

forming solder layers on both end portions of the surface of each electrode piece of the first and second electrode arrays;

positioning the first and second electrode arrays and the thermoelectric elements of first and second conductive types to alternately connect the electrode pieces of the first electrode array with the electrode pieces of the second electrode array in such a way that one end portion of each electrode array piece of the first electrode is connected with one end portion of an electrode piece of the second electrode array through the corresponding thermoelectric element of first conductive type while the other end portion of the each electrode piece of the first electrode array is connected with one end portion of another electrode piece of the second electrode array through the corresponding thermoelectric element of the conductive type; and heating the positioned first and second electrodes and thermoelectric elements with the solder layers therebetween to solder the electrode pieces to the thermoelectric elements.

The above and other objects, effects, features and advantages of the present invention will become more apparent from the following description of embodiments thereof taken in conjunction with the accompanying drawings.

BRIEF DESCRIPTION OF THE DRAWINGS

FIGS. 1A to 1C are diagrams showing the structure of an example of the thermoelectric module of the present invention, of which FIG. 1A is a top plan view, FIG. 1B a side view, and FIG. 1C a bottom plan view.

DETAILED DESCRIPTION OF PREFERRED EMBODIMENTS

The present invention will now be described in detail while referring to the accompanying drawings.

Figure 1A:
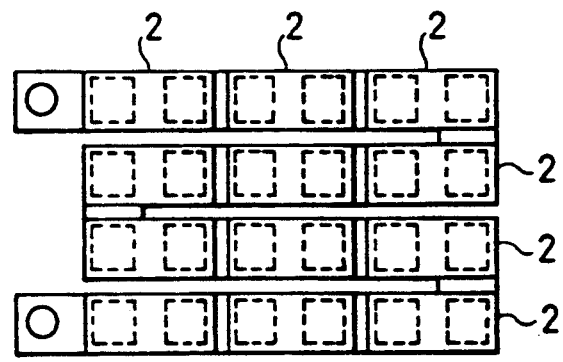
Figure 1B:
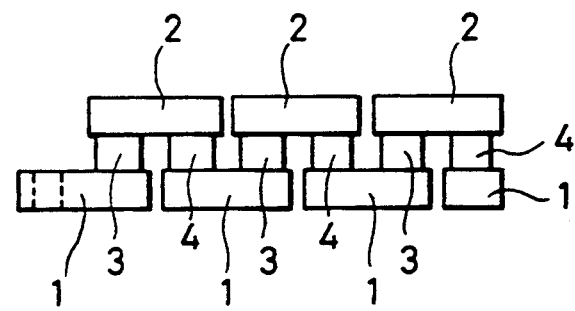
Figure 1C:
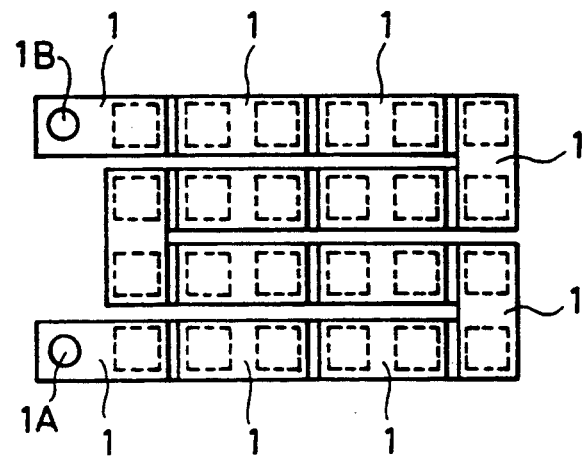

FIGS. 1A to 1C show an example of the thermoelectric module of the present invention. FIG. 1A is a top plan view, FIG. 1B a side view, and FIG. 1C a bottom plan view.

As shown in FIGS. 1A to 1C, the thermoelectric module of this example comprises a lower electrode array consisting of 13 electrode pieces 1 and an upper electrode array consisting of 12 electrode pieces 2 as an example. Each electrode piece 1 of the lower electrode array has one end portion connected with one end portion of an electrode piece 2 of the upper electrode array through a p-type thermoelectric element 3, and the other end portion is connected with one end portion of another electrode piece 2 of the upper electrode array through an n-type thermoelectric element 4, except that the two leftmost electrode pieces 1 of the lower electrode array each have a left end portion reserved for an output terminal. When the lower and upper electrode arrays of the thermoelectric module having the above-mentioned structure are brought into contact with a low temperatures source ($T_c$) and a high temperature source ($T_h$), respectively, electric currents in $T_c \rightarrow T_h$ and $T_h \rightarrow T_c$ directions are induced across the n-type thermoelectric elements 4 and p-type thermoelectric elements 3, respectively, to enable electric power to be withdrawn from output terminals 1A and 1B.

Preferably materials for the thermoelectric elements include chalcogenide alloys, preferably bismuth-antimony-selenium-tellurium alloys, doped with a dopant of p or n conductive type. More specifically, a $(Sb_2Te_3)_x(Bi_2Te_3)_y(Sb_2Se_3)_z$ alloy doped with 2 to 5 weight % of Te, wherein $x = 0.70$ to 0.72, $y = 0.23$ to 0.27 and $z = 0.03$ to 0.05, can be used as the material for the p-type thermoelectric element 3, while a $(Bi_2Te_3)_u(Sb_2Te_3)_v(Sb_2Se_3)_w$ alloy doped with 1.5 to $2.0 \times 10^{19}$ mol/cm$^3$ SbI$_3$, wherein $u = 0.90$ to 0.98, $v = 0$ to 0.5 and $w = 0.02$ to 0.05, can be used the material for the n-type thermoelectric elements 4.

Further, HgBr$_2$ and SbCl$_3$ can be used as n-type dopants, while Se can be used as a p-type dopant. Additionally, all other dopants capable of being used for the above-mentioned quasi-ternary alloys may be used. Furthermore, use may be made of quasi-binary alloys, such as a $(Sb_2Te_3)_{75}(Bi_2Te_3)_{25}$ alloy doped with Se or Te for the p-type thermoelectric elements 3 and a $(Bi_2Te_3)_{75}(Bi_2Se_3)_{25}$ alloy doped with HgBr$_2$ or SbCl$_3$ for n-type thermoelectric elements 4.

As materials for the electrodes 1 and 2, use can be made of metallic materials such as nickel, tungsten, and molybdenum. Use can also be made of electroconductive composite materials such as copper or aluminum coated or plated with molybdenum, tungsten, nickel or the like, copper or aluminum clad with a tungsten foil or a molybdenum foil, and composite materials of tungsten, molybdenum or nickel coated or plated with antimony.

An example of the process for producing a thermoelectric module according to the present invention will now be described while referring to FIGS. 2A to 2F.

An ingot of a material for p-type thermoelectric elements 3, prepared by doping an alloy having a composition of $(Sb_2Te_3)_{0.72}(Bi_2Te_3)_{0.25}-(Sb_2Se_3)_{0.03}$ with 3.5 weight % of Te, is pulverized with a ball mill or the like and mixed with a solvent such as propylene glycol to prepare a p-type paste. Similarly, an ingot of a material for n-type thermoelectric elements 4, prepared by doping an alloy having a composition of $(Bi_2Te_3)_{0.9}(Sb_2Te_3)_{0.05}(Sb_2Se_3)_{0.05}$ with $0.7 \times 10^{19}$ mol/cm$^3$ of SbI$_3$, is pulverized with a ball mill or the like and mixed with a solvent such as propylene glycol to prepare an n-type paste.

Figure 2A:
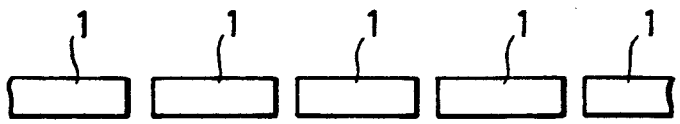
FIGS. 2A to 2F, FIGS. 3A to 3D, and FIGS. 4A to 4F are process diagrams illustrative of respective examples of the process for producing a thermoelectric module according to the present invention.

As shown in FIG. 2A, a plurality of electrode pieces 1 of copper coated with tungsten are disposed on respective predetermined areas of the surface of a holder (not shown). In FIGS. 2A to 2F, only one row of electrode pieces are shown for convenience of illustration, but in practice a predetermined number of electrode pieces for one or more modules are actually disposed in a plurality of rows on the surface of the holder.

Figure 2B:
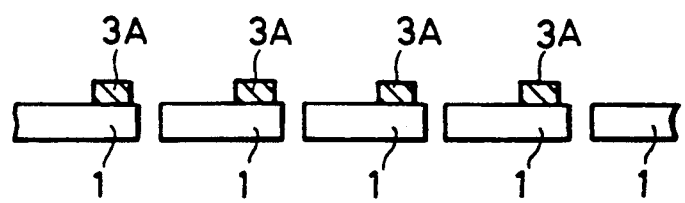

Subsequently, as shown in FIG. 2B, the above-mentioned p-type paste is applied on one end portion of each electrode piece 1 by printing or a like technique, and dried at 50° C. to form a p-type thermoelectric material layer 3A having predetermined form and thickness.

Figure 2C:
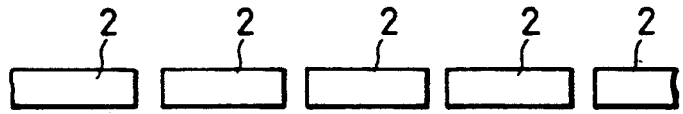
Figure 2D:
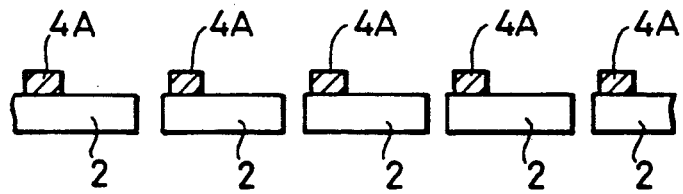

As shown in FIGS. 2C and 2D, a plurality of electrode pieces 2 made of the same material as used for the electrode pieces 1 are disposed in substantially the same manner as in the case of the electrode pieces 1, and the above-mentioned n-type paste is applied on one end portion of each electrode piece 2 and dried in substantially the same manner as in the case of the p-type paste to form an n-type thermoelectric material layer 4A.

Figure 2E:
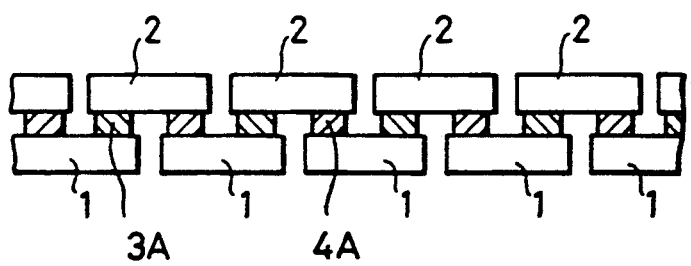

Subsequently, as shown in FIG. 2E, the electrode pieces with the respective thermoelectric material layers formed on the respective end portions thereof, while still fixed on the respective holders, are positioned and fixed with a fixing tool. This is performed in such a way that the electrode pieces 1 are confronted with the electrode pieces 2 with the thermoelectric material layers 3A and 4A sandwiched therebetween, with the p-type thermoelectric material layers 3A and the n-type thermoelectric layers 4A being positioned at opposite end portions of the electrode pieces.

Figure 2F:
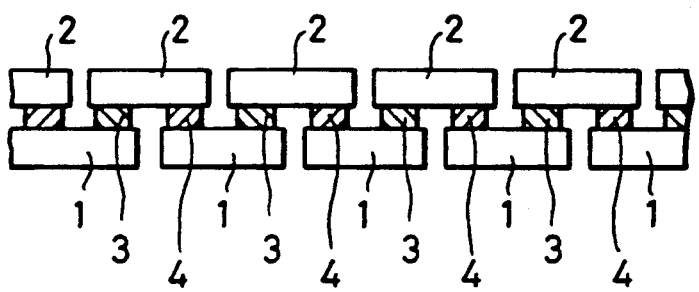

Thereafter, as shown in FIG. 2F, the thermoelectric material layers 3A and 4A on the respective end portions of the electrode pieces are preheated in a flow of non-oxidizing gas such as argon at about 175° C. for at least 3 hours, and then sintered in the same gas flow at a temperature of 460° to 480° C. to form p-type and n-type thermoelectric elements 3 and 4, respectively. At the same time the thermoelectric elements 3 and 4 are bonded to the electrode pieces 1 and 2 through a solid phase diffusion reaction. Thus, one or more thermoelectric modules are produced.

When a thermoelectric module produced according to the procedure described above is to be used as a thermoelectric power generation module which uses a difference in oceanic temperature as a heat source, for example, a module composed of thermoelectric elements, each having an area of $3 \text{ mm} \times 9 \text{ mm}$ and a thickness of 0.3 mm, and copper electrode pieces coated with tungsten, each electrode piece having an area of $11 \text{ mm} \times 11 \text{ mm}$ and a thickness of 1 mm, can be obtained. Those thermoelectric elements can each have a volume as small as less than one twentieth of that of a conventional thermoelectric element (13 mm in diameter $\times 1.5$ mm in thickness), and a weight per unit output as light as less than one tenth of that of the conventional thermoelectric element.

Figure 3A:
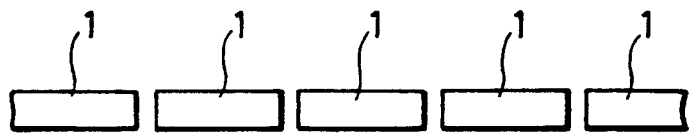
Figure 3B:
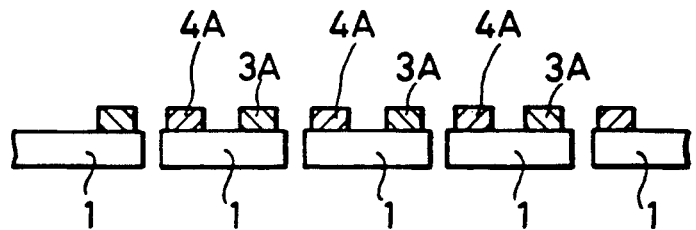
Figure 3C:
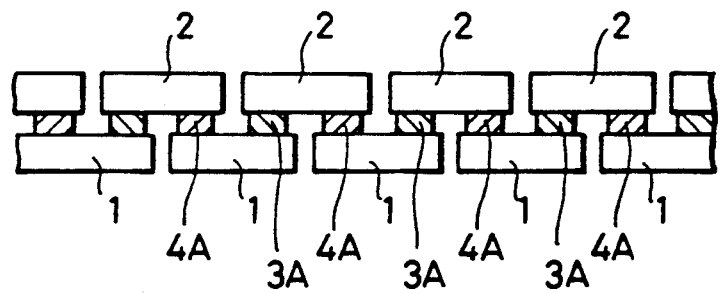
Figure 3D:
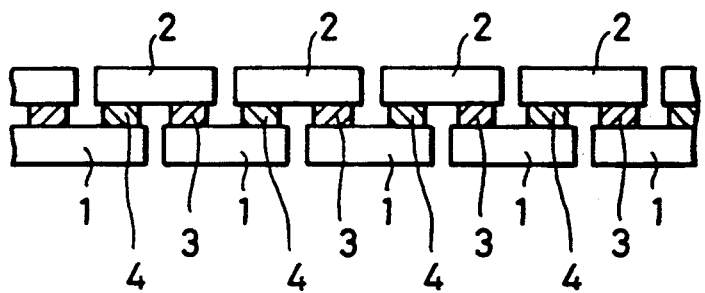

FIGS. 3A to 3D illustrate another example of a process for producing a thermoelectric module according to the present invention. First, pastes of p-type and n-type thermoelectric materials having the respective above-mentioned compositions are prepared. As shown in FIG. 3A, a predetermined number of electrode pieces 1 for one or more modules are disposed on a holder. Subsequently, as shown in FIG. 3B, the p-type past and the n-type paste are applied at opposite end portions of the electrode pieces 1 and dried to form p-type thermoelectric material layers 3A and n-type thermoelectric material 4A, respectively. Thereafter, as shown in FIG. 3C, electrode pieces 2 are positioned on the thermoelectric material layers 3A and 4A, which are then dried and sintered in the same manner as in the preceding example to form p-type and n-type thermoelectric elements 3 and 4, respectively. Thus, a thermoelectric module(s) as shown in FIG. 3D is produced.

According to the procedures as respectively illustrated in FIGS. 2A to 2F and FIGS. 3A to 3D, the production of a thermoelectric module does not require the step of cutting the thermoelectric material. Furthermore solid phase diffusion reaction is used which proceeds simultaneously with the sintering of the thermoelectric material layers to bond the resulting thermoelectric elements to the electrode pieces, without the step of bonding the former to the latter through soldering or a like technique. As a result, remarkable improvements in the yield and reliability, which have heretofore been impossible, can be realized.

Further, according to the above-mentioned procedures, since thermoelectric element layers can be sintered without a pressure molding process and in a non-oxidizing gas flow without sealing the thermoelectric module which is being produced in an ampule, productivity can be improved.

Figure 4A:
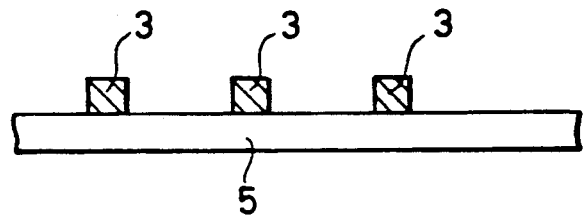
Figure 4B:
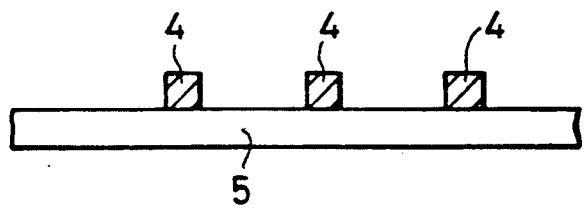
Figure 4C:
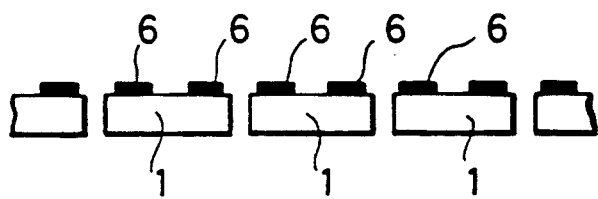
Figure 4D:
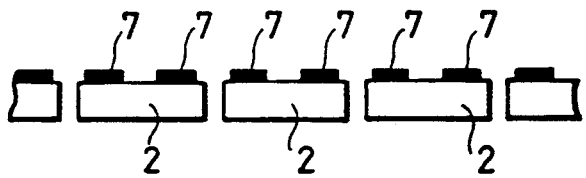
Figure 4E:
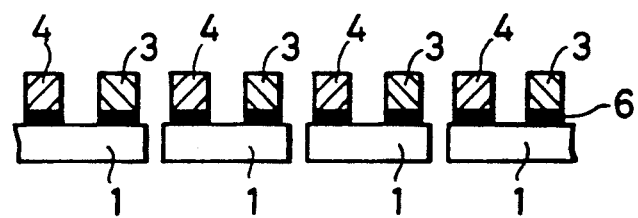
Figure 4F:
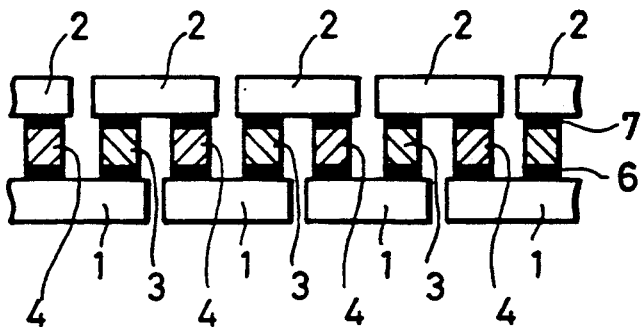

FIGS. 4A to 4F illustrate still another example of a process for producing a thermoelectric module according to the present invention. Pastes of p-type and n-type thermoelectric materials having the same respective compositions as in the foregoing examples are prepared. As shown in FIG. 4A, the p-type paste is applied on predetermined areas of the surface of a holder 5 (such a quartz glass plate) through printing or a like technique and dried at 50° C. to form p-type thermoelectric material layers having predetermined form and thickness simultaneously for one or more modules. Subsequently, the paste layers on the holder 5 are dried in a flow of argon at about 175° C. for at least 3 hours and then sintered in the same atmosphere at a temperature of 460° to 480° C. to form p-type thermoelectric elements 3 simultaneously for the one or more modules on the predetermined areas of the surface of the holder 5. As shown in FIG. 4B, a plurality of n-type thermoelectric elements 4 having predetermined form and thickness are formed on predetermined areas of the surface of a holder 5 in substantially the same manner as in the formation of the p-type thermoelectric elements 3. Subsequently, as shown in FIG. 4C, lower copper electrode pieces 1 are disposed on the predetermined areas of the surface of a holder, and a paste of a bismuth-tin eutectic solder is applied on both end portions of each electrode pieces 1 through printing or a like technique and dried to form solder layers 6. As shown in FIG. 4D, solder layers 7 are formed on upper copper electrode pieces 2 in substantially the same manner as described just above. Subsequently, as shown in FIG. 4E, the p-type and n-type thermoelectric elements 3 and 4, while still held on the respective predetermined areas, are positioned on the solder layers 6 formed on the lower copper electrode pieces 1. Thereafter, as shown in FIG. 4F, the upper copper electrode pieces 2 with the solder layers 7 formed thereon are positioned on the thermoelectric elements 3 and 4, followed by heating to effect soldering. Thus, a thermoelectric module(s) is produced.

According to the procedure as illustrated in FIGS. 4A to 4F, thermoelectric material layers are sintered without pressure molding and in a non-oxidizing gas flow without sealing the thermoelectric module which is being produced in an ampule, just like the examples illustrated in FIGS. 2A to 2F and FIGS. 3A to 3D.

Where a thermoelectric module produced according to the procedure described just above is to be used as a thermoelectric power generation module which uses a difference in oceanic temperature as a heat source, for example, a module composed of thermoelectric elements, each having an area of 3 mm×9 mm and a thickness of 0.3 mm and copper electrode pieces coated with tungsten, each electrode piece having an area of 11 mm×11 mm and a thickness of 1 mm, can be obtained. Those thermoelectric elements can each have a volume as small as less than one twentieth of insert the volume of a conventional thermoelectric element (13 mm in diameter×1.5 mm in thickness), and a weight per unit output as light as less than one tenth that of the conventional thermoelectric element, just like the aforementioned example.

Now a process for increasing the reliability of the thermoelectric modules produced according to the present invention, in which the sintering is effected without pressure molding, will be explained. In this process, for increasing the mechanical strength of the thermoelectric elements, a lead oxide glass frit is incorporated into the material for the thermoelectric elements. That is, a lead glass frit is added to a bismuth-antimony-selenium-tellurium alloy doped with a dopant to form a p-type or n-type thermoelectric material as mentioned above. Specifically, as a p-type thermoelectric material, use may be made of a $(Sb_2Te_3)_x(Bi_2Te_3)_y(Sb_2Se_3)_z$ alloy admixed with a lead glass frit and doped with 2 to 5 weight % of Te, wherein $x=0.70$ to $0.72$, $y=0.23$ to $0.27$ and $z=0.03$ to $0.05$, while as an n-type thermoelectric material, use may be made of a material of a $(Bi_2Te_3)_u(Sb_2Te_3)_v(Sb_2Se_3)_w$ alloy admixed with a lead glass frit and doped with 1.5 to $2.0\times10^{19}$ mol/cm$^3$ of SbI$_3$ wherein $u=0.90$ to $0.98$, $v=0$ to $0.5$ and $w=0.02$ to $0.05$.

As an example, ingot of an alloy having a composition of $(Sb_2Te_3)_{0.72}(Bi_2Te_3)_{0.25}(Sb_2Se_3)_{0.03}$, admixed with 0.5 weight % of a lead glass frit and doped with 3.5 weight % of Te, as a p-type thermoelectric material is pulverized with a ball mill or the like and mixed with a solvent such as propylene glycol to prepare a p-type paste. An ingot of an alloy having a composition of $(Bi_2Te_3)_{0.9}(Sb_2Te_3)_{0.05}(Sb_2Se_3)_{0.05}$, admixed with 0.5 weight % of a lead glass frit and doped with $1.7\times10^{19}$ mol/cm$^3$ of SbI$_3$, as an n-type thermoelectric material is pulverized with a ball mill or the like and mixed with a solvent such as propylene glycol to prepare an n-type paste. A thermoelectric module using the p-type and n-type pastes thus prepared can then be produced, for example, according to the procedure as illustrated in FIGS. 2A to 2F.

Where a thermoelectric module produced using the above-mentioned thermoelectric materials containing the lead glass frit according to the procedure as illustrated in FIGS. 2A to 2F is to be used as an thermoelectric power generation module which uses a difference in oceanic temperature as a heat source, for example, a module composed of thermoelectric elements, each having an area of 3 mm×9 mm and a thickness of 0.3 mm, and copper electrode pieces coated with tungsten, each electrode piece having an area of 11 mm×11 mm and a thickness of 1 mm, can be obtained. Those thermoelectric elements can each have a volume as small as less than one twentieth that of a conventional thermoelectric element (13 mm in diameter×1.5 mm in thickness), and a weight per unit output as light as less than one tenth of that of the conventional thermoelectric element.

Thermoelectric modules can also be produced using the above-mentioned thermoelectric materials containing the lead glass frit according to the respective procedures as illustrated in FIGS. 3A to 3D and FIGS. 4A to 4F.

The dimensions and output of the module produced according to the procedure as illustrated in FIGS. 3A to 3D are the same as those of the module produced according to the procedure as illustrated in FIGS. 2A to 2F. Where a thermoelectric module produced using the above-mentioned thermoelectric materials containing the lead glass frit according to the procedure as illustrated in FIGS. 4A to 4F is to be used as an electric power generation module which uses a difference in oceanic temperature as a heated source, for example, a module composed of thermoelectric elements, each having an area of 3 mm × 9 mm and a thickness of 0.3 mm, and copper electrode pieces coated with tungsten, each electrode piece having an area of 11 mm × 11 mm and a thickness of 1 mm, can be obtained. Those thermoelectric elements can each have a volume as small as less than one twentieth that of a conventional thermoelectric element (13 mm in diameter × 1.5 mm in thickness), and a weight per unit output as light as less than one tenth of that of the conventional thermoelectric element.

When a lead glass frit is incorporated into thermoelectric elements, the mechanical strength of the elements is improved as described above to provide higher reliability and thinner thermoelectric modules, and to facilitate the automation of production thereof.

Materials that can be used for forming the thermoelectric elements in the present invention include not only chalcogenide alloys such as bismuth-antimony-selenium-tellurium alloys as mentioned above, zinc-antimony alloys, and lead-tellurium alloys, but also all materials having a high thermoelectric figure of merit and capable of being sintered, from among which a suitable material may be chosen according to the use of the thermoelectric module to be produced and the temperature range within which the thermoelectric module is to be used.

As the amount of lead oxide glass frit incorporated into thermoelectric elements is increased, the mechanical strength of the thermoelectric elements rises. When the above-mentioned amount exceeds 2 weight %, however, the electric conductivity of the thermoelectric elements notably drops to lower the thermoelectric conversion characteristic thereof. As to the above-mentioned bismuth-antimony-selenium-tellurium alloys the optimum amount of the lead oxide glass frit is about 0.5 weight %, although the range of the amount of the lead oxide frit within which it serves effectively is from 0.1 to 2 weight %.

Any solvent can be used to form a paste of thermoelectric material insofar as it can provide a suitable paste viscosity and can be completely removed in the drying and preheating steps. As an electroconductive electrode material, use can be made of any material which can bond to a thermoelectric material with good electrical and mechanical bonding characteristics through a solid phase diffusion reaction in the sintering step and which can keep the diffusion from progressing excessively in the sintering step and/or during the use of the thermoelectric module so as not to degrade the thermoelectric conversion characteristics of the thermoelectric module. Examples of such an electrode material include the aforementioned metallic materials and electroconductive composite materials. In the procedures illustrated in FIGS. 2A to 2F and FIGS. 3A to 3D, however, copper, iron and copper plated with 30 μm-thick nickel are unsuitable as electroconductive electrode materials for use in combination with thermoelectric elements made of bismuth-antimony-selenium-tellurium alloy materials because they degrade the thermoelectric conversion characteristics in the sintering step. To form layers of p-type and n-type thermoelectric materials on electrode pieces, use can be made of not only the printing method but also the plasma spray method. A method in which a paste of a thermoelectric material, with the viscosity thereof adjusted to be low, is ejected from a nozzle to form layers having a predetermined form can also be used. In the latter two methods, neither a screen nor a mask is necessary. According to any one of these methods, layers of thermoelectric materials can be formed on electrode pieces without pressure molding. Without sealing a module that is being produced in an ampule, preheating and sintering can be affected in a flow of an inert gas or a reducing atmosphere of argon-diluted hydrogen, nitrogen or the like which prevents the thermoelectric elements that are being formed from oxidizing in the sintering step.

As described above, since the thermoelectric module of the present invention may have a thin structure, the weight thereof per unit output can be very light as compared with conventional thermoelectric modules. When a lead glass frit is incorporated into the thermoelectric elements of the thermoelectric module of the present invention, the mechanical strength of the elements and the reliability of the module can be improved. The inclusion of lead glass frit also facilitates the automation of production of thermoelectric modules and hence decreases the processing cost, which has heretofore been impossible.

According to the process of the present invention, since thermoelectric elements are produced by forming and sintering thin layers of materials to constitute thermoelectric elements, thermoelectric elements of 0.3 mm or less in thickness can be produced. This permits miniaturization of the thermoelectric modules and hence a decrease in the material cost, both of which have heretofore been impossible. Further, since every step of the process is operable simultaneously for one or more modules, several thermoelectric modules can be produced through a single run of the process. Additionally, since the process comprises formation, without pressure molding, and sintering, without sealing, of layers of thermoelectric materials to produce thermoelectric elements, the production of thermoelectric modules can be easily automated to decrease in the processing cost, which has heretofore been impossible.

Furthermore, the process of the present invention can prevent a decrease in the yield and the formation of defective modules as have heretofore occurred due to the steps of cutting and soldering a thermoelectric material. As a result, the processing cost is decreased and the reliability is improved.

The invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A thermoelectric module, comprising:
    a first electrode array having plurality of electrode pieces;

a second electrode array facing said first electrode array and having a plurality of electrode pieces; and a plurality of thermoelectric elements arranged between said first and second electrode arrays, wherein said electrode pieces of said first electrode array are alternately connected with said electrode pieces of said second electrode array through only said thermoelectric elements in such a manner that one thermoelectric element is directly connected by sintering to one end portion of a respective electrode piece of said first electrode array and directly connected by sintering to one end portion of a respective electrode piece of said second electrode array without the existence of a foreign intermediate layer, while another thermoelectric element is directly connected by sintering to another end portion of said respective electrode piece of said first electrode array and directly connected by sintering to one end portion of another respective electrode piece of said second electrode array without the existence of a foreign intermediate layer.

2. A thermoelectric module as claimed in claim 1, wherein said one thermoelectric element has a first conductivity type and said another thermoelectric element has a second conductivity type which differs from said first conductivity type.

3. A thermoelectric module as claimed in claim 2, wherein said thermoelectric elements of the first and second conductive types are respectively made of chalcogenide alloys containing two percent by weight or less of a lead oxide glass frit admixed therewith.

4. A thermoelectric module as claimed in claim 2, wherein said thermoelectric elements of the first and second conductivity types are respectively made of chalcogenide alloys.

5. A thermoelectric module as claimed in claim 4, wherein said thermoelectric elements of the first and second conductivity types are respectively made of p-type and n-type bismuth-antimony-selenium-tellurium alloys.

6. A thermoelectric module as claimed in claim 5, wherein said p-type bismuth-antimony-selenium-tellurium alloy is an $(Sb_2Te_3)_x(Bi_2Te_3)_y(Sb_2Se_3)_z$ alloy, where $x = 0.70$ to 0.72, $y = 0.23$ to 0.27, and $z = 0.03$ to 0.05, and wherein said n-type bismuth-antimony-selenium-tellurium alloy is a $(Bi_2Te_3)_u(Sb_2Te_3)_v(Sb_2Se_3)_w$ alloy, where $u = 0.90$ to 0.98, $v = 0$ to 0.05, and $w = 0.02$ to 0.05.

7. A thermoelectric module as claimed in claim 6, wherein said p-type alloy is doped with two to five percent of Te and said n-type alloy is doped with 1.5 to $2.0 \times 10^{19}$ mol/cm$^3$ of $SbI_3$.

8. A thermoelectric module as claimed in claim 5, wherein said p-type and n-type bismuth-antimony-selenium-tellurium alloys are respectively made of chalcogenide alloys containing two percent by weight or less of a lead oxide glass frit admixed therewith.

9. A thermoelectric module as claimed in claim 4, wherein said thermoelectric elements of the first and second conductivity type are respectively made of p-type and n-type binary chalcogenide alloys.

10. A thermoelectric module as claimed in claim 9, wherein said p-type chalcogenide alloy is an $(Sb_2Te_3)_{75}(Bi_2Te_3)_{25}$ alloy doped with at least one of Se and Te, and wherein said n-type chalcogenide alloy is a $(Bi_2Te_3)_{75}(Bi_2Se_3)_{25}$ alloy doped with at least one of $HgBr_2$ and $SbCl_3$.

11. A thermoelectric module as claimed in claim 1, wherein said electrode pieces of said first electrode array and said electrode pieces of said second electrode array are made of a metal selected from the group consisting of nickel, tungsten, and molybdenum.

12. A thermoelectric module as claimed in claim 1, wherein said electrode pieces of said first electrode array and said electrode pieces of said second electrode array are made of an electrically conductive composite material selected from the group consisting of copper coated with at least one of molybdenum, tungsten and nickel, aluminum coated with at least one of molybdenum, tungsten and nickel, copper clad with at least one of a tungsten foil and a molybdenum foil, and aluminum clad with at least one of a tungsten foil and a molybdenum foil.

13. A thermoelectric module as claimed in claim 1, wherein said plurality of thermoelectric elements are made by sintering a paste of thermoelectric substance provided between said electrode pieces of said first and second electrode arrays, and wherein connections between said thermoelectric elements and said electrode pieces are formed simultaneously by said sintering.

14. A thermoelectric module, comprising:
a first power output terminal;
a second power output terminal;
a pair of lower electrode pieces disposed adjacent one another in a lower plane, each of the lower electrode pieces having a flat top side with first and second end regions, each of the lower electrode pieces having a uniform composition at its top side;
an upper electrode piece disposed in an upper plane that is spaced apart from and parallel to the lower plane, the upper electrode piece having a flat bottom side with first and second end regions, the upper electrode piece having a uniform composition at its bottom side;
a first thermoelectric element having top and bottom ends and having a uniform composition from its top end to its bottom end, the top end of the first thermoelectric element being directly connected by sintering to the bottom side of the upper electrode piece at the first end region of the upper electrode piece, the bottom end of the first thermoelectric element being directly connected by sintering to the top side of one lower electrode piece of the pair at the first end region of said one lower electrode piece of the pair;
a second thermoelectric element having top and bottom ends and having a uniform composition from its top end to its bottom end, the top end of the second thermoelectric element being directly connected by sintering to the bottom side of the upper electrode piece at the second end region of the upper electrode piece, the bottom end of the second thermoelectric element being directly connected by sintering to the top side of the other lower electrode piece of the pair at the second end region of said other lower electrode piece of the pair;
first means for electrically connecting the first power output terminal to the first end region of said other lower electrode piece of the pair, the first means including at least one additional electrode piece disposed in the lower plane, at least one additional electrode piece disposed in the upper plane, and at least one additional thermoelectric element connecting the additional electrode pieces; and second means for electrically connecting the second power output terminal to the second end region of said one lower electrode piece of the pair, the second means including at least one further electrode piece disposed in the lower plane, at least one further electrode piece disposed in the upper plane, and at least one further thermoelectric element connecting the further electrode pieces.

15. The thermoelectric module of claim 14, wherein the upper electrode piece is made of a metal selected from the group consisting of nickel, tungsten, and molybdenum, and wherein the top ends of the first and second thermoelectric elements are sintered to said metal.

16. The thermoelectric module of claim 14, wherein the upper electrode piece is made of copper with a coating of at least one of molybdenum, tungsten, and nickel, and wherein the top ends of the first and second thermoelectric elements are sintered to the coating.

17. The thermoelectric module of claim 14, wherein the upper electrode piece is made of aluminum with a coating of at least one of molybdenum, tungsten, and nickel, and wherein the top ends of the first and second thermoelectric elements are sintered to the coating.

18. The thermoelectric module of claim 14, wherein the upper electrode piece is made of copper clad with a tungsten foil or an aluminum foil, and wherein the top ends of the first and second thermoelectric elements are sintered to the foil.

19. The thermoelectric module of claim 14, wherein the upper electrode piece is made of aluminum clad with a tungsten foil or a molybdenum foil, and wherein the top ends of the first and second thermoelectric elements are sintered to the foil.

20. The thermoelectric module of claim 14, wherein the first and second thermoelectric elements are made of chalcogenide alloys with different conductivity types, the chalcogenide alloys containing two percent by weight or less of a lead oxide glass frit admixed therewith.

21. The thermoelectric module of claim 14, wherein one of the first and second thermoelectric elements comprises a p-type bismuth-antimony-selenium-tellurium alloy, and wherein the other of the first and second thermoelectric elements comprises an n-type bismuth-antimony-selenium-tellurium alloy.

22. The thermoelectric module of claim 21, wherein the p-type alloy is an $(Sb_2Te_3)_x(Bi_2Te_3)_y(Sb_2Se_3)_z$ alloy, where $x=0.70$ to $0.72$, $y=0.23$ to $0.27$, and $z=0.03$ to $0.05$, and wherein the n-type alloy is a $(Bi_2Te_3)_u(Sb_2Te_3)_v(Sb_2Se_3)_w$ alloy, where $u=0.90$ to $0.98$, $v=0$ to $0.05$, and $w=0.02$ to $0.05$.

23. The thermoelectric module of claim 14, wherein the first and second thermoelectric elements are made of binary chalcogenide alloys with different conductivity types.

24. The thermoelectric module of claim 14, wherein one of the first and second thermoelectric elements comprises an $(Bi_2Te_3)_{75}(Bi_2Se_3)_{25}$ alloy doped with at least one of Se and Te, and wherein the other of the first and second thermoelectric elements comprises a $(Bi_2Te_3)_{75}(Bi_2Se_3)_{25}$ alloy doped with at least one of $HgBr_2$ and $SbCl_3$.

25. The thermoelectric module of claim 14, wherein the upper electrode piece has at one of molybdenum, tungsten, and nickel at its bottom surface, wherein the first and second thermoelectric elements comprise chalcogenide alloys having different conductivity types and having a lead oxide glass frit admixed therewith, and wherein the chalcogenide alloys are sintered to the at least one of molybdenum, tungsten, and nickel.

* * * * *